United States Patent
Cowpland

[15] 3,703,647
[45] Nov. 21, 1972

[54] VOLTAGE CLIPPING CIRCUIT

[72] Inventor: Michael C. J. Cowpland, Ottawa, Ontario, Canada

[73] Assignee: Microsystems International Limited, Ottawa, Ontario, Canada

[22] Filed: Dec. 14, 1970

[21] Appl. No.: 97,547

[30] Foreign Application Priority Data

Dec. 10, 1970 Canada..................100,304

[52] U.S. Cl...................................307/237, 307/257
[51] Int. Cl.............................................H03k 17/00
[58] Field of Search.......307/237, 202, 297, 310, 257

[56] References Cited

UNITED STATES PATENTS

| | | | |
|---|---|---|---|
| 2,927,223 | 3/1960 | Meirowitz | 307/237 X |
| 3,238,457 | 3/1966 | Boymel et al. | 307/237 X |
| 3,324,422 | 6/1967 | Lung | 307/310 X |
| 3,449,596 | 6/1969 | Millenberger et al. | 307/257 |

*Primary Examiner*—Herman Karl Saalbach
*Assistant Examiner*—B. P. Davis
*Attorney*—Edward E. Pascal

[57] ABSTRACT

A temperature-stable voltage clipping circuit, in which changes in voltage clipping levels caused by temperature-induced variation in the transfer characteristics of the clipping diodes are cancelled out.

6 Claims, 1 Drawing Figure

PATENTED NOV 21 1972 3,703,647
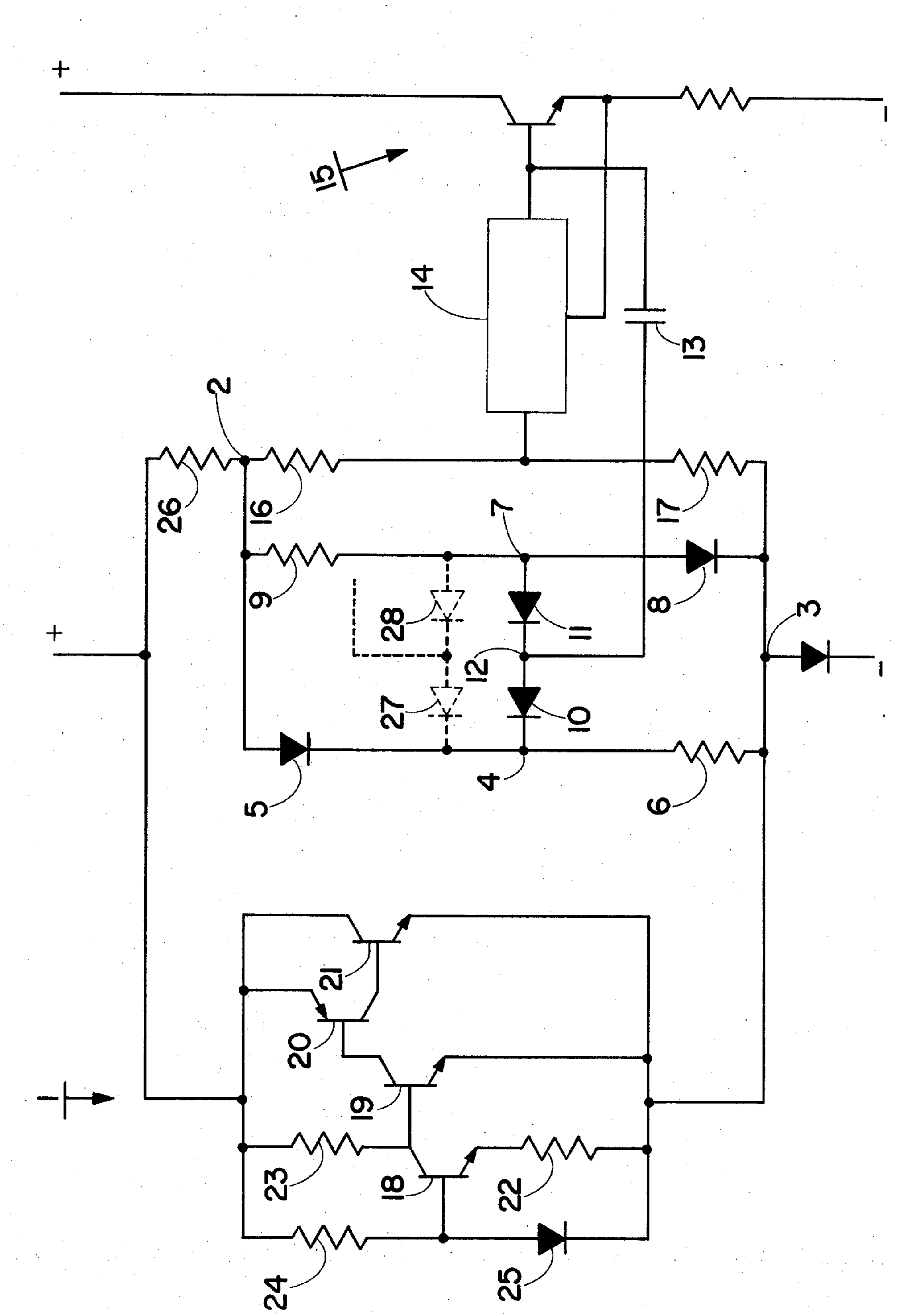
inventor MICHAEL C. J. COWPLAND
agent E. E. Pascal

VOLTAGE CLIPPING CIRCUIT

This invention relates to the field of voltage clipping circuits, and in particular to clipping circuits which have extreme stability with changes in ambient temperature.

Where it is desired to limit the potential amplitude of a signal, the signal being either of alternating character or of single polarity, it is common to utilize a pair of diodes connected in parallel, poled oppositely, between ground and a signal-carrying conductor. Should the signal potential rise above the threshold of conduction of one of the diodes, that diode is caused to conduct. Should the potential reverse in polarity, the second diode is caused to conduct when it's threshold of conduction has been exceeded. Therefore, the clipping of an alternating voltage signal occurs at twice the threshold of conduction voltage of one of the diodes.

It is well known that as the diodes are heated up, either by internal heating or by a rise in ambient temperature, their transfer characteristics and thresholds of conduction shift. If the clipping diodes carry large amounts of current, or in an environment in which temperature changes occur, heating of the diodes causes changes in the clipping voltage level due to the aforementioned shift in transfer characteristics, and changes in the amplitude of the clipped output signal occur.

Where the clipped signal is translated in a feedback oscillator, changes in clipped voltage level can vary the frequency of oscillation of the system. Where the frequency of oscillation is used to trigger a register in a telephone office, the stability of oscillation frequency is critical. Hence it is mandatory that the clipping circuit be rendered extremely stable with temperature variation in this application.

This invention achieves the desired result of extreme clipping amplitude stability with change in temperature, and hence may be advantageously used in the type of oscillator mentioned above, for instance in the tone generator of a multifrequency push button telephone set, such as the one described in U.S. Pat. application Ser. No. 117,400 filed Feb. 22, 1971 invented by M.C.J. Cowpland.

In addition, in this invention the clipping amplitude is advantageously not dependent on the thresholds of conduction of the diodes utilized, but is mainly dependent on a potential difference applied to the clipping circuit by an outside reference circuit.

The advantages of the invention may be obtained by providing a voltage clipping circuit comprising means for supplying a stable potential difference, having a positive and a negative terminal, a means for clamping a first junction point to a predetermined voltage lower than the positive terminal, means for clamping a second junction point to a predetermined voltage higher than the negative terminal, a pair of diode means serially and unidirectionally connected between the first and second junction points, the cathode and anode thereof being connected to the first and second junction points respectively, and means for applying a signal voltage to the junction of the pair of diode means.

A more detailed description of the invention will be given below, with reference to the single FIGURE of drawings, which shows the invention in schematic form.

Constant voltage reference circuit 1 supplies a stable unidirectional voltage difference between positive and negative terminals 2 and 3 respectively. A first junction point 4 is clamped to a predetermined voltage lower than the voltage at the positive terminal 2. The clamping of the junction point preferably is obtained by using a silicon semiconductor diode having its anode connected to positive terminal 2 and its cathode to first junction point 4, in conjunction with a first resistor 6 connected between first junction point 4 and negative terminal 3.

The voltage applied between positive terminal 2 and negative terminal 3 must be higher than that required to cause current to flow in silicon semiconductor 5, the amount of current being mainly controlled by first resistor 6. Under this condition, first junction point 4 will be clamped to a voltage equal to the voltage at terminal 2 less the voltage required to cause diode 5 to conduct (its conduction threshold value).

Similarly, means for clamping a second junction point 7 is connected to negative terminal 3. This preferably consists of a silicon semiconductor diode 8 having its cathode connected to negative terminal 3 and its anode to second junction point 7. A second resistor 9 completes the clamping circuit, being connected between second junction point 7 and positive terminal 2.

It may be seen that current will flow through second resistor 9 and silicon semiconductor diode 8, the current being limited by resistor 9; the voltage at second junction point 7 being clamped at the voltage at terminal 3 plus the voltage required to cause diode 8 to conduct (its conduction threshold value).

A pair of diode means are serially and unidirectionally connected between the first and second junction points, the cathode of the pair being connected to first junction point 4 and the anode of the pair being connected to second junction point 7. The diode means may advantageously be a pair of silicon semiconductor diodes similar to diodes 5 and 8.

The signal to be clipped is applied to the junction 12 of the pair of diode means.

As an example of its operation, let us consider that the voltage reference circuit causes a stable potential difference between terminals 2 and 3, of 1.2 volts, with terminal 3 as ground. Let us further assume that the threshold of conduction of each of semiconductor diodes 5, 8, 10, and 11 is 0.7 volts.

Thus it may be seen that first junction point 4 is clamped at 1.2 volts minus 0.7 volts, = 0.5 volts. Second junction point 7 is clamped at 0.7 volts. The potential difference across diodes 10 and 11 thus is the difference between the potentials at points 4 and 7, or 0.2 volts, with junction point 7 more positive. Junction point 12 will attain a potential level approximately intermediate of points 4 and 7, or about 0.6 volts.

Now let us assume that a signal is applied to junction 12. As the signal rises more positively, diode 11 will be biased in its reverse, non-conducting, "off" direction. On the other hand, diode 10 will be biased toward its conduction mode, and will indeed conduct when its conduction threshold has been exceeded with a potential of 0.7 volts thereacross. This potential difference will be obtained when the voltage at junction point 12 is 0.5 volts plus 0.7 volts, = 1.2 volts positive.

Similarly, if the signal applied at junction point 12 has a peak to peak amplitude of 1.2 volts, conduction will begin in either diode 10 or diode 11, at which point clipping of the applied signal will occur. The signal may therefore vary plus or minus 0.6 volts from a mean.

As a second example let us assume that the potential difference applied between terminals 2 and 3 is 10 volts. The voltage at first junction point 4 will thus be +9.3 volts, and the potential at second junction point 7 will be +0.7 volts. Junction 12 will be intermediate the two, at +5.0 volts.

In order for diode 10 to conduct, and thus to clip, the potential thereacross must be $9.3 - 5 + 0.7$ volts, $= 5$ volts. Similarly, for diode 11 to conduct, the potential thereacross must be $5.0 - 0.7 + 0.7 = 5$ volts.

A signal peak to peak amplitude of 10 volts may thus be tolerated at junction 12 in this clipping circuit before diodes 10 and 11 conduct and limit any further increases in amplitude through heavy conduction.

In consideration of the above, it may be seen that the clipping level is controlled by the value of the reference voltage applied to terminals 2 and 3, rather than by the threshold of conduction of diodes 5, 8, 10, and 11.

While the aforementioned advantage is very useful, an even greater advantage is achieved with this circuit, as was mentioned earlier in this disclosure. The clipping level is found to be virtually unchanged with temperature variations. As was described, increases or decreases in temperature normally change the transfer characteristics and the threshold of conduction of semiconductor diodes, caused by an increasing number of mobile current carriers under the influence of thermal agitation. In previous clipping circuits, these variations with temperature cause the clipping level to change, and should the clipped voltage be partially determinative of the oscillation frequency of an oscillator, the frequency of oscillation will be caused to vary to an undesirable extent as temperature changes. This undesirable characteristic is avoided in this invention.

Following the circuit described with reference to FIG. 1, the maximum voltage at junction point 12 may be calculated as the voltage at positive terminal 2, minus the voltage drop (conduction threshold) across diode 5, plus the voltage drop (conduction threshold) across diode 10. Since the thresholds of conduction of diodes 5 and 10 are the same if the diodes are similar, when clipping occurs (conduction taking place in diode 10), the voltage drops across diodes 5 and 10 will be identical. Therefore the voltage drops cancel out in the relationship outlined above, and the maximum voltage at junction point 12 equals the voltage at positive terminal 2.

Similarly, the minimum voltage at junction point 12 may be calculated as the voltage found at negative terminal 3, which we have considered in this discussion as being ground zero.

The voltage at junction point 12 thus may swing only between zero and the value of potential of positive terminal 2. The two examples outlined above are thus substantiated.

Since the thresholds of conduction, or the voltage across the diodes do not appear in the expression determining the clipping voltage level, as the thresholds of conduction change as the temperature of the diodes change, any effects of ambient temperature changing the clipping level are cancelled, and the clipping level remains as constant as the constant voltage reference source 1. Thus an extremely stable clipping level is achieved.

By applying a bias between first junction point 4 and junction 12, the clipping amplitude, as well as the relative amplitudes of the positive and negative portions of an alternating signal may be further changed. A varying unidirectional potential applied in that manner to junction point 12 may be controlled and regulated to a predetermined amplitude.

In FIG. 1, the input signal is applied via capacitor 13 from the output of a filter 14 which is connected in oscillator circuit 15. A ground or bias potential for filter 14 may be obtained from a voltage divider circuit comprising resistors 16 and 17.

In a preferred circuit, with a reference voltage between positive and negative terminals 2 and 3 of 1.2 volts, each of resistors 6 and 9 should have a value of 12,000 ohms, and each of diodes 5, 8, 10, and 11 should be a silicon semiconductor diode.

The stable voltage reference circuit 1 may be similar to the one shown in FIG. 1. An NPN first transistor 18 has its collector connected to the base of NPN second transistor 19, which in turn has its collector connected to the base of PNP third transistor 20. The collector of transistor 20 is connected to the base of NPN transistor 21. The emitters of transistors 19 and 21 are connected to negative terminal 3, as is the emitter of first transistor 18 through a suitable bias resistor 22, which may be 1600 ohms. The collector of fourth transistor 21, as well as the emitter of third transistor 20 and the collector of first transistor 18 (through resistor 23) which may be 20,000 ohms are connected together, providing a source of voltage approximately 1.3 volts, temperature stable.

Resistor 24 which may be 2,000 ohms and diode 25 are connected as shown between the supply point of positive voltage, the base of first transistor 18, and the negative terminal 3.

Resistor 26 may be used to drop the voltage supplied by the voltage reference circuit to exactly that required by the voltage clipping circuit for clipping an input signal to a predetermined value. With combined resistors 16 and 17 having a value of 1,700 ohms resistor 26 should be 800 ohms. A power supply of about the voltage supplied to the voltage reference circuit may be applied across the voltage reference circuit at the places marked with according polarity signs.

If a second signal is to be clipped to the same amplitude as the first without interference to the first, the clipping circuit described above may be used with a small addition. This variation becomes very useful where a pair of oscillators provide 2 tones simultaneously, as in well known push button dialed telephone sets.

A second pair of diodes 27 and 28, shown in dashed lines, may be serially and unidirectionally connected between junction points 4 and 7 in exact parallel and in the same conductive direction with the series of diodes 10 and 11. A second signal, which of course may be of a second frequency and second amplitude, is applied to the junction between diodes 27 and 28. It has been found that with this structure, the two signals to be clipped will not interact, and the two oscillators will operate independently. Additional signals may be clipped to similar amplitudes by connecting additional series of clipping diodes between junction points 4 and 7 in a similar manner, and applying the signals individually to the junction points between the clipping diodes.

What is claimed is:

1. A voltage clipping circuit comprising:

a. a single voltage source for supplying a stable voltage difference between a positive and a negative terminal, b. means connected to the positive terminal for clamping a first junction point to a predetermined voltage lower than that at the positive terminal, c. means connected to the negative terminal for clamping a second junction point to a predetermined voltage higher than that at the negative terminal, d. a pair of diode means serially and unidirectionally connected between the first and second junction points, the cathode and the anode thereof being connected to the first and second junction points respectively, e. said predetermined voltages each being about equal to the threshold of conduction voltages of each of the diode means, and f. means for applying a signal voltage to the junction of the pair of diode means.

2. A circuit as defined in claim 1, in which the (b) means comprises a resistor connected between the negative terminal and the first junction point, and a first clamping diode having its anode and cathode connected to the positive terminal and the first junction point respectively;

and in which the (c) means comprises a resistor connected between the positive terminal and the second junction point, and a second clamping diode having its anode and cathode connected to the second junction point and the negative terminal respectively.

3. A circuit as defined in claim 2, in which the pair of diode means comprises two semiconductor clipping diodes; a clipping diode and a clamping diode mutually connected to one of said junction points having transfer characteristics which change similarly with diode temperature change.

4. A circuit as defined in claim 2, in which the pair of diode means comprises two semiconductor clipping diodes; all of said clipping and clamping diodes having transfer characteristics which change similarly with diode temperature change.

5. A circuit as defined in claim 4, further including a second pair of serially and unidirectionally connected semiconductor clipping diodes, connected in the same polarity sense as the first pair of diodes between the first and second junction points, and means for applying a second signal voltage to the junction of the second pair of diodes.

6. A circuit as defined in claim 4, in which the conduction threshold of the clipping and clamping diodes is about one half the value of the voltage difference between the first and second junction points $\pm 0.1$ volt.

* * * * *